United States Patent [19]
Greco et al.

[11] Patent Number: 6,127,639
[45] Date of Patent: Oct. 3, 2000

[54] APPARATUS AND METHOD FOR ACTIVATING AND DEACTIVATING A SWITCH

[75] Inventors: Gerald A. Greco, Elk Grove Village; John J. Connell, Lake Zurich; Daniel J. Lecinski, Arlington Heights; Amir Koradia, Palatine, all of Ill.

[73] Assignee: 3Com Corporation, Rolling Meadows, Ill.

[21] Appl. No.: 09/449,253

[22] Filed: Nov. 24, 1999

[51] Int. Cl.$^7$ ....................................................... H01H 9/02
[52] U.S. Cl. ............................ 200/293; 361/759; 439/911
[58] Field of Search .............................. 200/51.09, 50.28, 200/50.31; 439/911; 361/760, 759

[56] References Cited

U.S. PATENT DOCUMENTS

| | | | |
|---|---|---|---|
| 4,716,497 | 12/1987 | Craker | 361/395 |
| 5,675,475 | 10/1997 | Mazura et al. | 361/798 |
| 5,989,043 | 11/1999 | Han et al. | 439/157 |
| 5,993,235 | 11/1999 | Chen | 439/326 |
| 5,999,411 | 12/1999 | Patel | 361/759 |
| 6,053,756 | 4/2000 | Flanigan et al. | 439/315 |

*Primary Examiner*—Michael L. Gellner
*Assistant Examiner*—Nhung Nguyen
*Attorney, Agent, or Firm*—Baniak Nicholas Pine & Gannon

[57] ABSTRACT

An apparatus for activating and deactivating a switch mounted on a circuit board includes a bracket and a switch actuator opening formed in the bracket to receive a switch actuator. The switch actuator is operatively connected to the switch and is biased in a first direction. The bracket further includes a mounting post having an opening formed therein for receiving a fastener. A sleeve member is positioned over the mounting post. The sleeve member includes a flange portion for contacting the switch actuator to activate and deactivate the switch.

19 Claims, 3 Drawing Sheets

APPARATUS AND METHOD FOR ACTIVATING AND DEACTIVATING A SWITCH

FIELD OF THE INVENTION

This invention relates generally to the field of switches and in particular, to an apparatus and method for activating and deactivating a switch mounted on a circuit board assembly housed in an electronic chassis.

BACKGROUND OF THE INVENTION

An electronic chassis which houses electronic components for high speed telecommunication and networking applications typically includes two card guide assemblies mounted between side walls of the chassis, one located adjacent the top of the chassis and the other located adjacent the bottom of the chassis. A backplane circuit board having various surface mounted connectors is typically fastened to the two card guide assemblies and forms the back wall of the chassis. A plurality of vertically oriented circuit board assemblies, each of which are typically comprised of a circuit board attached to a rigid U-shaped channel member, are typically inserted into the chassis along the card guide assemblies. When a circuit board assembly is fully inserted into the chassis, the circuit board is connected to the backplane circuit board. The backplane circuit board typically supplies power to the plurality of circuit board assemblies located within the chassis.

Typically, electrical power is supplied to the circuit board of the circuit board assembly only when the circuit board is fully inserted in the chassis and the circuit board is physically connected to the backplane circuit board. The circuit board assembly is typically secured to the chassis by fastening screws which secure the U-shaped channel member to the frame of the chassis.

Problems may arise when a user attempts to install or remove a circuit board assembly from the backplane circuit board while the backplane circuit board is providing power to adjacent circuit board assemblies. When a user desires to remove a circuit board assembly from the chassis, the fastening screws are removed so that the channel member can be separated from the chassis. When the circuit board assembly is pulled outward in a direction away from the backplane circuit board, the electrical connection between the circuit board and the backplane circuit board is broken. The physical removal of the circuit board while it is electrically connected to the backplane circuit board oftentimes has an adverse electrical effect of the adjacent circuit board assemblies. Similarly, installing a circuit board assembly while the backplane circuit board is providing power to adjacent circuit board assemblies may also have an adverse effect on the electronics within the system.

Accordingly, it would be desirable to have an apparatus for activating and deactivating a switch mounted on a circuit board assembly housed in an electronic chassis that overcomes the disadvantages described above.

SUMMARY OF THE INVENTION

One aspect of the invention provides an apparatus for activating and deactivating a switch mounted on a circuit board including a bracket and a switch actuator opening formed in the bracket to receive a switch actuator. The switch actuator is operatively connected to the switch and is biased in a first direction. The bracket further includes a mounting post having an opening formed therein for receiving a fastener. A sleeve member is positioned over the mounting post. The sleeve member includes a flange portion for contacting the switch actuator to activate and deactivate the switch. The sleeve member may preferably include an opening having a circumference to receive the fastener. The fastener may preferably include a head portion having a circumference greater than the circumference of the opening in the sleeve member to ensure that the sleeve member remains positioned over the mounting post. The fastener may preferably extend through the opening in the sleeve member and into the opening in the mounting post. The opening in the mounting post may preferably be threaded to receive the fastener. The fastener may preferably be a screw. The sleeve member may preferably have a generally cylindrical shape having a circumference and the mounting post may preferably have a generally cylindrical shape having a circumference. The circumference of the sleeve member may preferably be greater than the circumference of the mounting post. The circuit board may preferably be attached to the bracket. The flange portion may preferably include a pin extending substantially perpendicular from the flange portion. The pin may preferably be received in a second opening in the bracket to prevent rotation of the sleeve member around the mounting post. The sleeve member may preferably include a ridge portion and the mounting post may preferably include a recess portion adapted to interlock with the ridge portion to prevent the rotation of the sleeve member around the mounting post.

Another aspect of the invention provides a method of activating a switch mounted on a circuit board. A bracket and a switch actuator opening formed in the bracket are provided. The switch actuator is received in the switch actuator opening and is operatively connected to the switch. The switch actuator is biased in a first direction. The bracket further includes a mounting post having an opening formed therein. A fastener is received in the opening formed in the mounting post. A sleeve member is positioned over the mounting post. The sleeve member includes a flange portion. The sleeve member is moved in a second direction opposite the first direction. The flange portion contacts against the switch actuator, and the switch is activated. The fastener may preferably be moved in the second direction. The fastener may preferably be contacted against the sleeve member. The switch actuator may preferably be moved in the second direction. The flange portion may preferably include a pin extending substantially perpendicular from the flange portion. The pin may preferably be inserted into a second opening in the bracket. Rotation of the sleeve around the mounting post may preferably be prevented.

Another aspect of the invention provides a method of deactivating a switch mounted on a circuit board. A bracket and a switch actuator opening formed in the bracket are provided. The switch actuator is received in the switch actuator opening and is operatively connected to the switch. The switch actuator is biased in a first direction. The bracket further includes a mounting post having an opening formed therein. A fastener is received in the opening formed in the mounting post. A sleeve member is positioned over the mounting post. The sleeve member includes a flange portion contacting the switch actuator. The sleeve member is moved in the first direction and the switch is deactivated. The fastener may preferably be moved in the first direction. The switch actuator may preferably be moved in the first direction.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE PRESENTLY PREFERRED EMBODIMENTS

Figure 1:
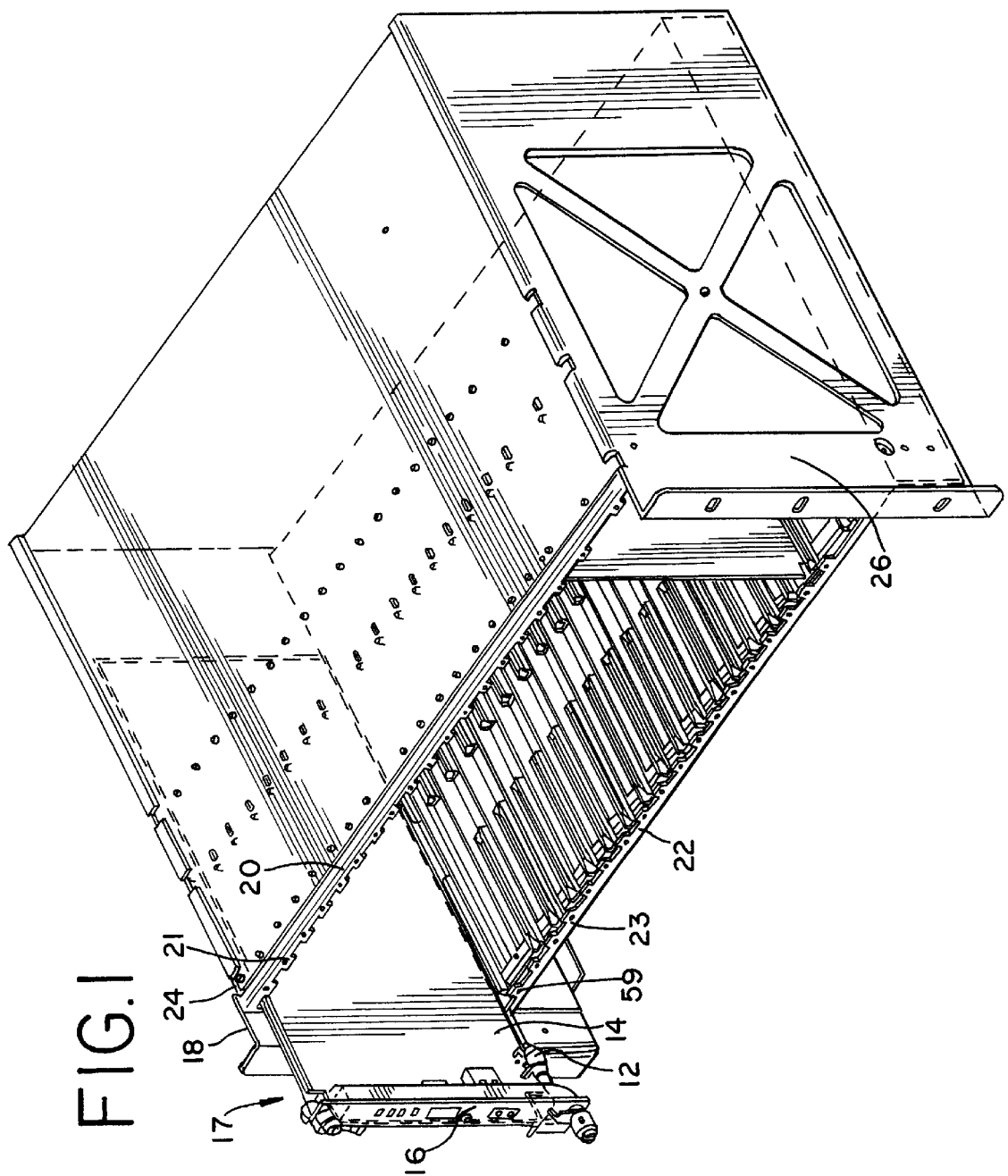
FIG. 1 is a perspective view of a preferred embodiment of an apparatus for activating and deactivating a switch mounted on a circuit board that is made in accordance with the invention. The circuit board is shown exploded from an electronic chassis.
Figure 2:
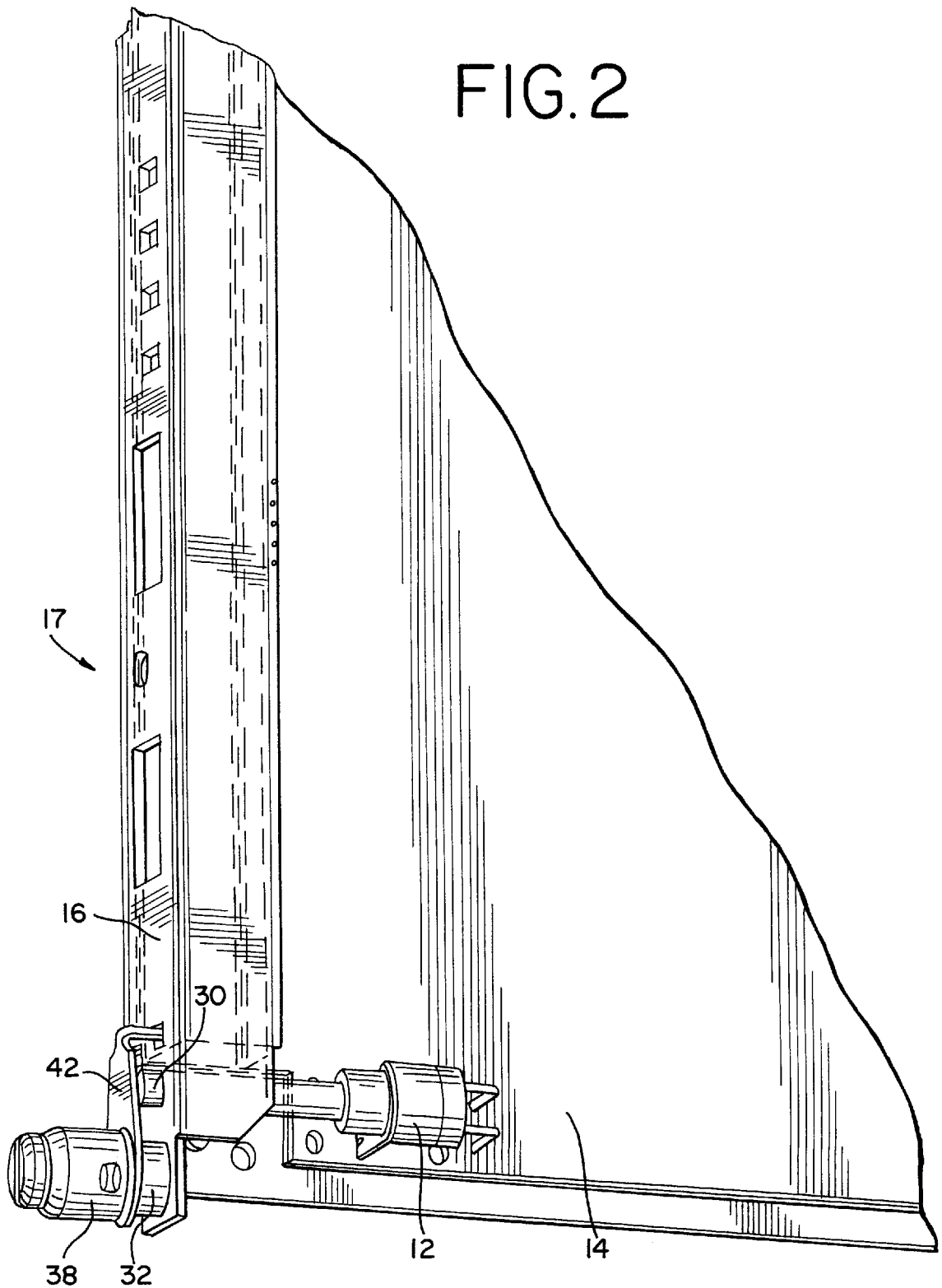
FIG. 2 is a partial perspective view of the embodiment of FIG. 1.
Figure 3:
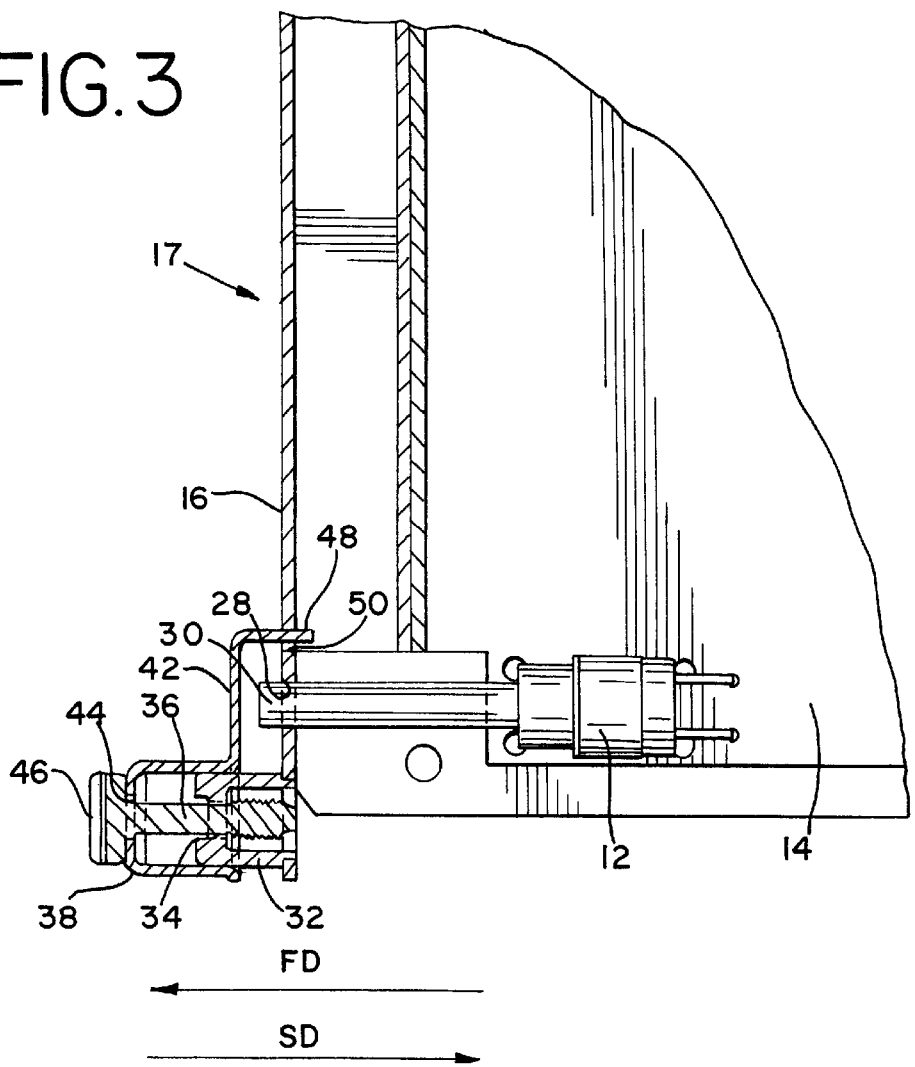
FIG. 3 is a sectional view of the embodiment of FIG. 2.

Referring to FIGS. 1–3, a preferred embodiment of an apparatus for activating and deactivating a switch 12 mounted on a circuit board 14 is shown. The switch 12 is mounted on the circuit board 14, which in turn is attached to a bracket 16.

As shown in FIG. 1, the circuit board 14 and the bracket 16 form a circuit board assembly 17 that is adapted to be inserted into an electronic chassis 18. In particular, the circuit board assembly 17 may preferably be received by a first card guide assembly 20 and a second card guide 22 assembly of the electronic chassis 18. In the embodiment shown, the first card guide assembly 20 extends between side walls 24, 26 of the electronic chassis 18 adjacent the top end of the side walls 24, 26. Similarly, the second card guide assembly 22 extends between the side walls 24, 26 of the electronic chassis 18 adjacent the bottom end of the side walls 24, 26. The first and second card guides assemblies 20, 22 may be comprised of any suitable rigid material such as, for example, steel, aluminum or any other suitable metallic material. The first and second card guide assemblies 20, 22 provide a guide for the circuit board assembly 17 when it is inserted into the electronic chassis 18. The electronic chassis 18 may preferably be any suitable enclosure for housing various electronic components, and may preferably be comprised of steel, aluminum or any other suitable metallic material.

Once installed in the electronic chassis 18, the circuit board assembly 17 is mechanically connected to a backplane circuit board (not shown) which is positioned along a back portion of the electronic chassis 18 and which forms the back wall of the electronic chassis 18. The backplane circuit board may preferably be comprised of any conventional printed circuit board adapted to receive the circuit board assembly 17 positioned within the electronic chassis 18. The backplane circuit board provides power to the circuit board assembly 17. However, as discussed below, the activation and deactivation of the switch 12, as more fully discussed below, controls the power to the circuit board 14.

The circuit board 14 may preferably be any conventional printed circuit board. Similarly, the bracket 16 may preferably be any suitable bracket to allow to the circuit board 14 to be secured to the bracket 16. Referring again to FIG. 1, the bracket 16 may preferably be configured to be mounted to mounting surfaces 21, 23 of the first and second card guide assemblies 20, 22. In the embodiment shown in FIGS. 1–3, the bracket 16 is a generally U-shaped member, although other configurations are contemplated.

As shown in FIG. 3, a switch actuator opening 28 is formed in the bracket 16 to receive a switch actuator 30. The switch actuator 30 is operatively connected to the switch 12. The switch actuator 30 may preferably be any mechanical plunger that actuates the switch 12 mounted on the circuit board 14. The switch 12 may preferably be any commercially available switch that controls the flow of power to the circuit board 14. The switch 12 may preferably be spring loaded so that the switch actuator 30 is biased in a first direction. The arrow in FIG. 3 shows the first direction (FD).

Referring to FIGS. 2–3, the bracket 16 further includes a mounting post 32. The mounting post 32 may preferably be a separate member that is fixedly mounted to the bracket 16. Alternatively, the mounting post 32 may be integrally formed with the bracket 16. The mounting post 32 includes an opening 34 formed therein for receiving a fastener 36. The mounting post 32 may preferably have a generally cylindrical shape, although other configurations are contemplated. The opening 34 in the mounting post 32 may preferably be threaded to receive the fastener 36. The fastener may preferably be a screw, although other types of rigid fasteners such as bolts, etc. are contemplated. Moreover, the mounting post 32 may preferably be configured so that it holds the fastener 36 captive within the opening 34 in the mounting post 32. As a result, the fastener 36 will not be able to separate from the mounting post 32 when the bracket 16 is not connected to the electronic chassis 18.

Referring to FIGS. 2–3, a sleeve member 38 is positioned over the mounting post 32. The sleeve member 38 includes a flange portion 42. The flange portion 42 contacts the switch actuator 30 to activate and deactivate the switch 12. As shown in FIG. 3, the sleeve member 38 preferably includes an opening 44 having a circumference to receive the fastener 36. The fastener 36 includes a head portion 46 having a circumference greater than the circumference of the opening 44 in the sleeve member 38. This ensures that the sleeve member 38 remains positioned over the mounting post 32 and cannot separate from the mounting post 32. The fastener 36 may preferably extend through the opening 44 in the sleeve member 38, and the fastener 36 may preferably extend into the opening 34 in the mounting post 32.

The sleeve member 38 may preferably have a generally cylindrical shape, although other shapes and configurations are contemplated. The circumference of the sleeve member 38 may preferably be greater than the circumference of the mounting post 32 to allow the sleeve member 38 to be positioned over the mounting post 32.

Referring to FIG. 3, the flange portion 42 of the sleeve member 38 may preferably include a pin 48 extending substantially perpendicular to the flange portion 42. The pin 48 may preferably be received in a second opening 50 in the bracket 16. The advantage of this arrangement is that the pin 48 prevents the rotation of the sleeve member 38 around the mounting post 32.

Figure 4:
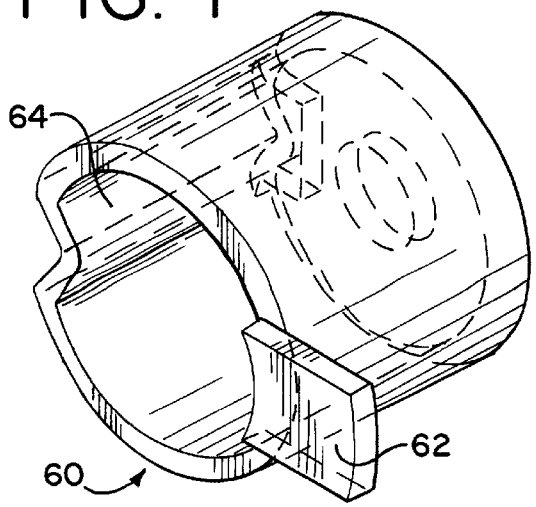
FIG. 4 is a perspective view of an alternative embodiment of a sleeve member that is made in accordance with the invention.
Figure 5:
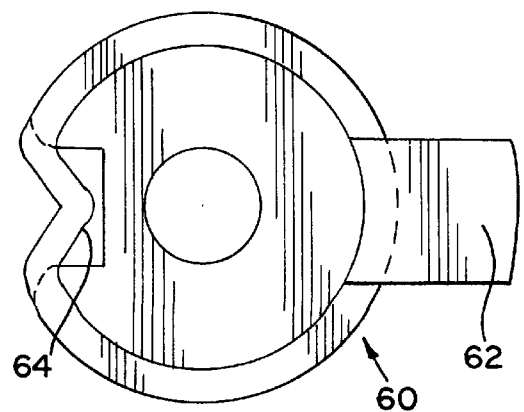
FIG. 5 is a front view of the embodiment of FIG. 4.

FIGS. 4–5 show an alternative embodiment of a sleeve member 60. In the embodiment shown, the sleeve member 60 has a generally cylindrical shape and, like the sleeve member 38, is configured to be positioned over the mounting post 32. The sleeve member 60 also includes a flange portion 62 for contacting the switch actuator 30 to activate and deactivate the switch 12. In this embodiment, the sleeve member 60 is keyed to prevent the rotation of the sleeve member 60 around the mounting post 32. In particular, the sleeve member 60 includes a ridge portion 64 that extends along the length of the sleeve member 60. For this alternative embodiment, the mounting post may preferably include a recess portion adapted to interlock with the ridge portion 64 to prevent rotation of the sleeve member 60.

Referring to FIGS. 1–3, the apparatus shown may be used to activate the switch 12. The circuit board 14 may preferably be inserted into the electronic chassis 18 and may preferably be mechanically connected to the backplane circuit board within the electronic chassis 18. The fastener 36 is moved in a second direction (SD) opposite the first direction (see FIG. 3). The fastener 36 may preferably be moved in the second direction (SD) by rotating the fastener 36 in a clockwise direction. When the fastener 36 is moved in the second direction (SD), it is received in an opening 59 formed in the mounting surface 23 of the second card guide assembly 22 (see FIG. 1). The fastener 36 contacts the sleeve member 38 and moves the sleeve member 38 in the second direction opposite the first direction (FD). The flange portion 42 of the sleeve member 38 contacts the switch actuator 30 and moves the switch actuator 30 in the second direction (SD). When the fastener 36 is fully inserted into the opening 59 in the second card guide assembly 22, the switch actuator 30 activates the switch 12 mounted on the circuit board 14. The pin 48 of the sleeve member 38 may preferably be inserted into the second opening 50 in the bracket 16 to prevent rotation of the sleeve member 38 around the mounting post 32. This arrangement has the advantage of providing for the automatic activation of the switch 12 when the bracket 16 is mounted to the electronic chassis 18. Moreover, this arrangement ensures that power to the circuit board 14 is not provided to the circuit board 14 until the circuit board 14 is completely and securely mechanically fastened to the backplane circuit board. This reduces electrical problems associated with the installation of a circuit board assembly 17 to the backplane circuit board when the backplane circuit board is providing power to adjacent circuit board assemblies.

The switch 12 may deactivated by moving the fastener 36 in the first direction (FD). This may preferably be accomplished by rotating the fastener 36 in a counter-clockwise direction. This allows the sleeve member 38 and the spring-biased switch actuator 30 to move in the first direction (FD). When the fastener 36 is no longer engaged with the second card guide assembly 22, the switch 12 is deactivated. After the switch 12 is deactivated, the circuit board 14 may be mechanically disconnected from the backplane circuit board and removed from the electronic chassis 18. The advantage of this arrangement is that power to the circuit board 14 is automatically shut off from the circuit board 14 before the circuit board 14 is disconnected from the backplane circuit board. This also eliminates electrical problems associated with the removal of a circuit board assembly from the backplane circuit board when the backplane circuit board is providing power to adjacent circuit board assemblies.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An apparatus for activating and deactivating a switch mounted on a circuit board comprising:

a bracket, a switch actuator opening formed in the bracket to receive a switch actuator, the switch actuator operatively connected to the switch, the switch actuator biased in a first direction, the bracket further including a mounting post, the mounting post including an opening formed therein for receiving a fastener, a sleeve member positioned over the mounting post, the sleeve member including a flange portion for contacting the switch actuator to activate and deactivate the switch.

2. The apparatus of claim 1 wherein the sleeve member includes an opening having a circumference to receive the fastener.

3. The apparatus of claim 2 wherein the fastener includes a head portion having a circumference greater than the circumference of the opening in the sleeve member to ensure that the sleeve member remains positioned over the mounting post.

4. The apparatus of claim 2 wherein the fastener extends through the opening in the sleeve member and wherein the fastener extends into the opening in the mounting post.

5. The apparatus of claim 1 wherein the opening in the mounting post is threaded to receive the fastener.

6. The apparatus of claim 5 wherein the fastener is a screw.

7. The apparatus of claim 1 wherein the sleeve member has a generally cylindrical shape having a circumference and the mounting post has a generally cylindrical shape having a circumference.

8. The apparatus of claim 7 wherein the circumference of the sleeve member is greater than the circumference of the mounting post.

9. The apparatus of claim 1 wherein the circuit board is attached to the bracket.

10. The apparatus of claim 1 wherein the flange portion includes a pin extending substantially perpendicular from the flange portion, the pin received in a second opening in the bracket to prevent rotation of the sleeve member around the mounting post.

11. The apparatus of claim 1 wherein the sleeve member includes a ridge portion and the mounting post includes a recess portion adapted to interlock with the ridge portion to prevent the rotation of the sleeve member around the mounting post.

12. A method of activating a switch mounted on a circuit board comprising:

providing a bracket, a switch actuator opening formed in the bracket, the switch actuator received in the switch actuator opening, the switch actuator operatively connected to the switch, the switch actuator biased in a first direction, the bracket further including a mounting post, the mounting post including an opening formed therein, a fastener received in the opening formed in the mounting post, a sleeve member positioned over the mounting post, the sleeve member including a flange portion;

moving the sleeve member in a second direction opposite the first direction;

contacting the flange portion against the switch actuator; and activating the switch.

13. The method of claim 12 further comprising the steps of:

moving the fastener in the second direction.

14. The method of claim 12 further comprising the steps of:

contacting the fastener against the sleeve member.

15. The method of claim 12 further comprising the steps of:

moving the switch actuator in the second direction.

16. The method of claim 12 wherein the flange portion includes a pin extending substantially perpendicular from the flange portion and further comprising the steps of:

inserting the pin into a second opening in the bracket; and preventing rotation of the sleeve around the mounting post.

17. A method of deactivating a switch mounted on a circuit board comprising:

providing a bracket, a switch actuator opening formed in the bracket, the switch actuator received in the switch actuator opening, the switch actuator operatively connected to the switch, the switch actuator biased in a first direction, the bracket further including a mounting post, the mounting post including an opening formed therein, a fastener received in the opening formed in the mounting post, a sleeve member positioned over the mounting post, the sleeve member including a flange portion contacting the switch actuator;

moving the sleeve member in the first direction; and deactivating the switch.

18. The method of claim 17 further comprising the steps of:

moving the fastener in the first direction.

19. The method of claim 17 further comprising the steps of:

moving the switch actuator in the first direction.

* * * * *